United States Patent [19]

Steinmann

[11] Patent Number: 5,356,740
[45] Date of Patent: Oct. 18, 1994

[54] RADIATION-SENSITIVE COMPOSITIONS

[75] Inventor: Alfred Steinmann, Praroman, Switzerland

[73] Assignee: Ciba-Geigy Corporation, Ardsley, N.Y.

[21] Appl. No.: 979,498

[22] Filed: Nov. 20, 1992

[30] Foreign Application Priority Data

Nov. 26, 1991 [CH] Switzerland ............ 3462/91-1

[51] Int. Cl.$^5$ ........................... G03C 3/00
[52] U.S. Cl. ........................ 430/18; 430/285; 430/326; 522/165; 528/272; 528/274
[58] Field of Search ............ 430/18, 285, 326; 522/165; 528/272, 274

[56] References Cited

U.S. PATENT DOCUMENTS 4,663,269  5/1987  Narang et al. ............ 430/326

OTHER PUBLICATIONS

Polymer Journal 19, pp. 31–49 (1987).
Polym. Mater. Sci. Eng. 60, pp. 170–173 (1989).

*Primary Examiner*—Marion E. McCamish
*Assistant Examiner*—Mark A. Chapman
*Attorney, Agent, or Firm*—William A. Teoli, Jr.

[57] ABSTRACT

Radiation-sensitive compositions comprising
(a) a polyester containing structural repeating units of formula (I)

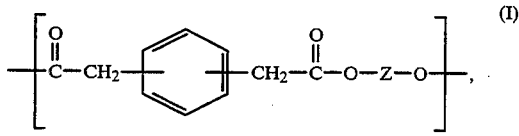

wherein Z is a radical of formulae (IIa)–(IIh)

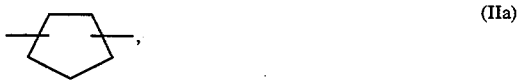

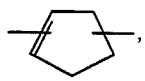

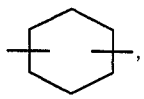

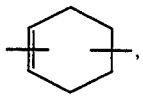

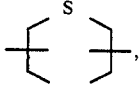

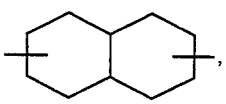

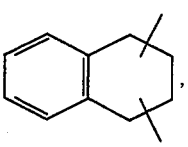

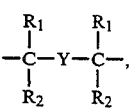

wherein Y is a direct bond, $C_1$–$C_{20}$alkylene, phenylene, —$CH_2$—$C_6H_4$—$CH_2$—, cyclopentylene or cyclohexylene, and $R_1$ and $R_2$ are each independently of the other hydrogen, methyl or ethyl, with the proviso that $R_1$ and $R_2$ are not simultaneously hydrogen, and (b) a substance that generates acid upon exposure to actinic radiation, form a highly sensitive high resolution positive photoresist formulation which is suitable for DUV lithography and, in particular, for making integrated circuits.

12 Claims, No Drawings

RADIATION-SENSITIVE COMPOSITIONS

The present invention relates to photosensitive compositions comprising a polyester derived from phenylenediacetic acid derivatives and secondary or tertiary diols, and a substance which generates acid upon exposure to actinic radiation, and to the use of said compositions as photoresists in DUV lithography.

Photoresist compositions based on polycarbonates and onium salts that are suitable for lithography in the deep-UV range (DUV, wavelengths from c. 200 nm to c. 300 nm) are described, inter alia, in Polymer Journal 19, pp. 31–49 (1987). The synthesis of the polycarbonates described therein by phase-transfer catalysed polycondensation of bis(p-nitrophenyl)carbonates and diols is rather complicated. Moreover, the polymers so obtained have fairly low molecular weights. After exposure to quite high doses of radiation, these photoresists are developed by heating the exposed film to 80° C. A subsequent vacuum treatment or immersion in organic solvents is necessary for complete removal of the monomeric or oligomeric decomposition products.

The DUV photoresist compositions of onium salts and polycarbonates disclosed in U.S. Pat No. 4,663,269 yield high-resolution images, but require rather high exposure energies and likewise organic solvents for the development of the resists.

Polym. Mater. Sci. Eng. 60, pp. 170–173 (1989) describes radiation-sensitive compositions that comprise a polyester derived from terephthalic or isophthalic acid derivatives and an onium salt and are useful for the preparation of structured positive images. The polyesters disclosed in this reference, which are prepared by the rather troublesome polycondensation of dibromides and bisphenols under phase-transfer catalysis, absorb even in the DUV range, thereby resulting in a lower sensitivity of the compositions in this wavelength range.

It has now been found that polyesters derived from phenylenediacetic acid derivatives which can be prepared by straightforward solution polycondensation have a high transparency in the DUV range and, together with a radiation-sensitive acid generator, constitute a highly sensitive resist formulation that is suitable for resolving structures in the submicron range.

Specifically, the invention relates to a radiation-sensitive composition comprising (a) a polyester containing structural repeating units of formula (I)

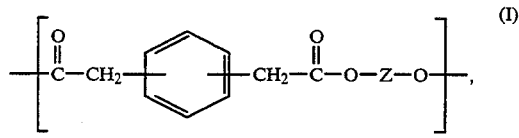

(I)

wherein Z is a radical of formulae (IIa)–(IIh)

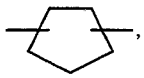

(IIa)

(IIb)

(IIc)

(IId)

(IIe)

(IIf)

(IIg)

$$-\overset{R_1}{\underset{R_2}{C}}-Y-\overset{R_1}{\underset{R_2}{C}}-,$$

(IIh)

wherein Y is a direct bond, $C_1$–$C_{20}$alkylene, phenylene, —$CH_2$—$C_6H_4$—$CH_2$—, cyclopentylene or cyclohexylene, and $R_1$ and $R_2$ are each independently of the other hydrogen, methyl or ethyl, with the proviso that $R_1$ and $R_2$ are not simultaneously hydrogen, and (b) a substance that generates acid upon exposure to actinic radiation.

The polyesters of formula (I) are derived from derivatives of 1,2-phenylenediacetic acid and, preferably, of 1,3- or 1,4-phenylenediacetic acid. Polyesters that are derived from derivatives of 1,4-phenylenediacetic acid are especially preferred.

Z in formula (I) defined as cyclopentylene is preferably 1,3-cyclopentylene.

Z in formula (I) defined as cyclopentenylene is preferably 1,3-cyclopent-4-enylene.

Z in formula (I) defined as cyclohexylene is 1,2-cyclohexylene, 1,3-cyclohexylene or, preferably, 1,4-cyclohexylene.

Z in formula (I) defined as cyclohexenylene is preferably 1,4-cyclohex-5-enylene.

Y in formula (IIh) defined as $C_1$–$C_{20}$alkylene may be branched or, preferably, unbranched alkylene radicals. Alkylene radicals are typically methylene, ethylene, propylene, butylene, pentylene, hexylene, decylene and dodecylene.

Y as phenylene is preferably 1,4-phenylene.

Y in formula (IIh) defined as cyclopentylene is preferably 1,3-cyclopentylene.

Y in formula (IIh) defined as cyclohexylene is preferably 1,4-cyclohexylene.

It is preferred to use inventive compositions in which component (a) is a polyester of formula (I), wherein Z is a group of formula (IIh).

Compositions in which component (a) is a polyester of formula (I), wherein Z is a group of formula (IIh) and Y is 1,4-phenylene, are particularly preferred.

More preferred compositions are those in which component (a) is a polyester of formula (I), wherein Z is a group of formula (IIh), Y is 1,4-phenylene, $R_1$ is hydrogen and $R_2$ is methyl.

A further preferred composition contains as component (a) a polyester of formula (I), wherein Z is a group of formula (IIh), Y is $C_1$–$C_{20}$alkylene, $R_1$ is hydrogen and $R_2$ is methyl.

Compositions in which component (a) is a polyester of formula (I), wherein Z is 1,4-cyclohexylene, are especially preferred.

The most preferred compositions are those in which component (a) is a polyester of formula (I), wherein Z is the divalent radical of 1,4-dihydroxy-1,2,3,4-tetrahydronaphthalene after removal of the hydroxyl groups.

Some of the polyesters of formula (I) are known, inter alia from JP-A 60/164425, and can be prepared by polycondensing a phenylenediacetic acid derivative, typically phenylenediacetyl di-p-nitrophenolate, phenylenediacetyl dibromide or, preferably, phenylenediacetyl dichloride, with a diol of formula (III)

wherein Z is as defined for formula (I), in an aprotic polar solvent in the presence of a base.

Polyesters of high molecular weight can be prepared by such a homogeneous solution polycondensation.

The dihydroxy compounds of formula (III) are known and some are commercially available. Typical examples of suitable compounds of formula (III) are 1,2- or 1,3-dihydroxycyclopentane, 1,2-, 1,3-or 1,4-dihydroxycyclohexane, 2,5-dihydroxy-1,4-dithiane, 1,5-dihydroxydecahydronaphthalene, 1,4-dihydroxy-1,2,3,4-tetrahydronaphthalene, 2,5-dihydroxyhexane, 2,6-dihydroxyheptane, 2,7-dihydroxyoctane, 1,2-bis( 1-hydroxyethyl)benzene, 1,3-bis( 1-hydroxyethyl)benzene, 1,4-bis( 1-hydroxyethyl)benzene, 1,2-bis( 1-hydroxyethyl)cyclohexane, 1,3-bis( 1-hydroxyethyl)cyclohexane, 1,4-bis( 1-hydroxyethyl)cyclohexane, 1,4-bis(2-hydroxypropyl)benzene and 1,4-bis(2-hydroxypropyl)cyclohexane.

A host of compounds are known as photosensitive components b) which generate or split off acid on exposure to light. Such compounds include the diazonium salts used in diazotype, the o-quinonediazides used in known positive-working copying compositions, or also halogen compounds which form hydrohalic acid on exposure to radiation. Compounds of this type are disclosed, inter alia, in U.S. Pat. Nos. 3,515,552, 3,536,489 or 3,779,778, as well as in De-A-2 718 259, 2 243 621 or 2 610 842.

Particularly suitable photosensitive components b) of the composition of this invention are cationic photoinitiators selected from the group of the iodonium or sulfonium salts. Such compounds are described in "UV-Curing, Science and Technology" (Editor: S. P. Pappas, Technology Marketing Corp., 642 Westover Road, Stanford, Conn., USA).

Sulfoxonium salts can also be used as photosensitive compounds. Such salts are disclosed, inter alia, in EP-B-35 969 or in EP-A-44 274 and 54 509. Aliphatic sulfoxonium salts which absorb in the deep-UV range merit special mention.

It is also possible to use compounds which generate sulfonic acids on exposure to actinic light. Such compounds are known per se and are disclosed, inter alia, in GB-A 2 120 263, EP-A 84 515, 37 152or58 638 and in U.S. Pat. Nos. 4,258,121 or 4,371,605.

Salts used as photosensitive components b) which generate an acid are preferably soluble in organic solvents. Most preferably, these salts are salts of complex acids, typically of hydroborofluoric acid, hexafluorophosphoric acid, hexafluoroarsenic acid or hexafluoroantimonic acid.

It is preferred to use an iodonium, sulfonium or sulfoxonium salt as component (b) in the novel compositions.

It is particularly preferred to use triphenylsulfonium triflate or triphenylsulfonium hexafluoroantimonate as component (b).

The novel compositions preferably contain 85–99% by weight, most preferably 92–98% by weight, of component (a), and 1–15% by weight, most preferably 2–8% by weight, of component (b), based on the total amount of components (a) and (b).

A binder (c) may also be added to the novel radiation-sensitive compositions. This addition is especially useful if the light-sensitive compositions are liquid or low viscosity compositions.

The amount of binder (c) may be 30–90% by weight, preferably 60–90% by weight, based on the total amount of components (a), (b) and (c).

The choice of binder will depend on the respective field of use and the properties required therefor, such as ease of development in aqueous and aqueous-alkaline solvent systems or adhesion to substrates.

Suitable binders (c) are typically novolaks which are derived from an aldehyde, preferably acetaldehyde or furfuraldehyde, but most preferably from formaldehyde and a phenol. The phenolic component of this binder is preferably phenol itself or also halogenated phenol, for example substituted by one or two chlorine atoms, preferably p-chlorophenol, or it is a phenol substituted by one or two $C_1$–$C_9$alkyl groups, typically o-, m- or p-cresol, a xylenol, p-tert-butylphenol or p-nonylphenol. The phenol component of the preferred novolaks may also, however, be p-phenylphenol, resorcinol, bis(4-hydroxyphenyl)methane or 2,2-bis ( 4-hydroxyphenyl)-propane.

Some of the phenolic hydroxyl groups of these novolaks may also be modified by reaction with chloroacetic acid, isocyanates, epoxides or carboxylic anhydrides.

Exemplary of further suitable binders are copolymers of maleic anhydride with styrene or vinyl ethers or 1-alkenes. It is also possible to use as binders homo- and copolymeric acrylates and methacrylates, typically copolymers of methylmethacrylate/ethyl acrylate/methacrylic acid, poly(alkylmethacrylates) or poly(alkylacrylates), where alkyl=$C_1$–$C_{20}$.

It is preferred to use as binder an alkali-soluble substance such as a novolak (which may be modified as described above), copolymers of maleic anhydride with styrene or vinyl ethers or 1-alkenes, as well as copolymers of esters of acrylic acid or methacrylic acid with ethylenically unsaturated acids, typically methacrylic acid or acrylic acid.

Further additional resins may be added to these alkali-soluble binders, as is common practice with positive-working systems based on diazo ketone. These additional resins include typically vinyl polymers, such as polyvinyl acetate, polyacrylates, polyvinyl ethers or polyvinyl pyrrolidones. Normally, however, not more than 20% by weight of these additional resins, based on the amount of alkali-soluble binder, are added.

The compositions of this invention may contain further conventional modifiers such as stabilisers, pigments, dyes, fillers, adhesion promoters, flow control agents, wetting agents and plasticisers. For application, the compositions may also be dissolved in a suitable solvent.

The compositions of this invention have excellent suitability as coating compositions for all kinds of substrates, such as wood, textiles, paper, ceramics, glass, plastics materials such as polyester, polyethylene terephthalate, polyolefins or cellulose acetate, preferably in the form of films, and metals, typically Al, Cu, Ni, Fe, Zn, Mg or Co, and GaAs, Si or $SiO_2$, on which it is desired to apply an image by imagewise exposure.

The coated substrates can be produced, for example, by preparing a solution or suspension of the composition.

The choice of solvent and the concentration depends mainly on the nature of the composition and on the coating method. The solution is uniformly applied to a substrate by known coating methods, for example by spin coating, immersion, doctor coating, curtain coating, brushing, spraying, especially by electrostatic spraying and reverse roller coating. It is also possible to apply the light-sensitive layer to a temporary flexible support and then to coat the final substrate, for example a copper-clad circuit board, by coat transfer by means of lamination.

The add-on (layer thickness) and the nature of the substrate are contingent on the desired utility. A particular advantage of the compositions of the invention is that they can be used in widely varying layer thicknesses. This thickness range comprises values of c. 0.5 μm to more than 100 μm. With conventional positive systems based on naphthoquinone diazide, layer thicknesses of preferably smaller than 10 μm can be used.

Possible utilities of the novel copolymers are as photoresists in the electronics field (galvanoresist, discharge resist, solder resist), the production of printing plates such as offset plates or screen printing formes, mould etching, or especially as photoresist in the production of integrated circuits.

On account of the very high resolution (submicron range), the novel photoresist compositions are particularly suitable for making microchips. The use of the novel formultions as photoresists for making integrated circuits is therefore a further object of the invention.

In accordance with the versatile utilities, the possible substrates and processing conditions may differ widely.

Sheets made from polyester, cellulose acetate or plastics-coated papers are typically used for the photographic recording of information. Specially treated aluminium is used for offset formes, and copper-clad laminates are used for producing printed circuits, and silicon wafers are used for making integrated circuits. The layer thicknesses for photographic materials and offset printing formes are from c. 0.5 μm to 10 μm, and for printed circuits 1 to c. 100 μm.

After the substrate has been coated, the solvent is normally removed by drying to give a layer of photoresist on the substrate.

After image-wise exposure of the material in conventional manner, the exposed areas of the photoresist are washed out with a developer.

The choice of the developer depends on the type of photoresist, especially on the nature of the binder used or of the photolysis products. The developer may comprise aqueous solutions of bases to which organic solvents or mixtures thereof may be added.

Particularly preferred developers are the aqueous-alkaline solutions used for the development of naphthoquinone diazide resists. These include in particular aqueous solutions of alkali metal silicates, phosphates, hydroxides and carbonates. These solutions may additionally contain minor amounts of wetting agents and-/or organic solvents.

Typical organic solvents are those which are miscible with water and can be added to the developer liquids, for example cyclohexanone, 2-ethoxyethanol, toluene, acetone, as well as mixtures of two or more such solvents.

The expression "imagewise exposure" means exposure through a photomask which contains a predetermined pattern, typically a transparency, exposure by a beam of laser light which is moved by computer control over the surface of the coated substrate to produce an image, exposure by computer controlled electron beams, as well as exposure with X-rays through an appropriate mask.

Suitable light sources are quite generally all lamps that emit radiation in the DUV range (c. 200–300 nm). Point light sources as well as arrays of reflector lamps are suitable. Examples are: carbon arcs, xenon arcs, mercury vapour lamps which may be doped with halogen atoms (metal halide lamps), fluorescent lamps, argon glow lamps, electronic flash lamps, photographic flood lamps, electron beams and X-rays. The distance between lamp and image material may vary substantially, depending on the utility and the type of lamp, typically from 2 cm to 150 cm. Particularly suitable light sources are laser light sources, for example argon ion lasers or crypton ion lasers. With laser light the resist can also be exposed without a photomask, as the laser beam writes direct on to the resist layer. The high sensitivity of the compositions of the invention is very advantageous here and permits high writing speeds at relatively low intensities. This method can be used to make printed circuits for the electronics industry, lithographic offset plates or relief printing plates as well as photographic image recording materials. The high sensitivity of the resists is also advantageous for exposure by means of DUV steppers, as very brief exposure times are desired.

The invention therefore also relates to the printing formes, printed circuits, integrated circuits or silver-free photographic films produced with the novel compositions.

I. Synthesis of the polyesters (component (a))

I.1. Polyester from 1,4-phenylenediacetyl dichloride and 1,4-dihydroxy-1,2,3,4-tetrahydronaphthalene A solution of 41.6 g (0,527 mol) of pyridine in 50 ml of methylene chloride is added dropwise at 0°–5° C. to a solution of 41.2 g (0.251 mol) of 1,4-dihydroxy-1,2,3,4-tetrahydronaphthalene (prepared according to U.S. Pat. No. 3,534,109) and 58 g (0.251 mol) of phenylenediacetyl dichloride (prepared according to J. Pol. Sci., Part A-1, 7, pp. 3393–3405 (1969)) in 350 ml of methylene chloride. The reaction mixture is stirred overnight at room temperature. The viscous solution is added dropwise to methanol/water (5:1), whereupon a tacky substance precipitates. The precipitate is dissolved in tetrahydrofuran and precipitated once more from methanol/water (5:1). The resultant polymer is isolated and dried under a high vacuum. Yield: 56 g (69%)

Elemental analysis: calcd: C: 74.52 H: 5.63 Cl: 0.0 found: C: 73.68 H: 5.57 Cl: 0.0

The molecular weight determined by gel permeation chromatography is:
$M_n = 9000$
$M_w = 26\,000$
$M_w/M_n = 2.9$ I.2. Polyester from phenylenediacetyl dichloride and 1,4-dihydroxycyclohexane 5.026 g (43.2 mmol) of 1,4-dihydroxycyclohexane and 10 g of (43.2 mmol) of phenylenediacetyl dichloride are charged under argon to 80 ml of methylene chloride and the mixture is cooled to 0° C. While cooling with ice, a solution of 7.19 g (90.9 mmol) of pyridine in 20 ml of methylene chloride is added dropwise over 30 minutes. After heating to room temperature, the reaction mixture is stirred for 15 hours. The solution is filtered and the filtrate is added dropwise to methanol/water (5:1) to precipitate the polymer. The crude product is subsequently dissolved in 200 ml of methylene chloride. The solution is filtered and the polymer is precipitated from 1.5 liters of hexane and then dried under a high vacuum. Yield: 10 g (85%)

Elemental analysis: calcd: C: 70.06 H: 6.61 Cl: 0.0 found: C: 69.43 H: 6.72 Cl: 0.0

The molecular weight determined by gel permeation chromatography is:
$M_n = 11\,000$
$M_w = 24\,000$
$M_w/M_n = 2.2$ II. Application Examples II.1. Positive resist 2.5 g of the polyester prepared in Example I.1. and 0.125 g of triphenylsulfonium triflate are dissolved in 12 g of cyclopentanone. The solution is filtered through a 0.5 micron filter and coated on a silicon wafer. By spin coating (silicon wafer) for 20 seconds at 5500 rpm a homogeneous film is produced on the wafer. The film is then dried for 2 minutes at 100° C. The resultant resist film has a layer thickness of 1.25 μm. The resist film is exposed through a quartz mask by the vacuum contact method with UV radiation of 254 nm wavelength. An exposure energy of 8-11 mJ/cm² is required. After exposure, the film is heated for 90 seconds on a hot plate which is heated to 80° C. and subsequently developed for 60 seconds in an aqueous alkaline developing bath (Selectiplast PD 2007, Merck), whereupon the exposed zones are washed out (positive resist). The resist film is washed with deionised water and dried at 90° C. Analysis by electron scanning microscopy show vertical contours and fully resolved semimicron structures.

II.2. Positive resist 10 g of the polyester prepared in Example 1.2. and 0.5 g of triphenylsulfonium hexafluoroantimonate are dissolved in 60 g of cyclopentanone. The solution is filtered through a 0.5 micron filter and coated on a silicon wafer. By spin coating (silicon wafer) for 20 seconds at 4000 rpm a homogeneous film is produced on the wafer. The film is then dried for 2 minutes at 90° C. The resultant resist film has a layer thickness of 1.0 μm. The resist film is exposed through a quartz mask by the vacuum contact method with UV radiation of 254 nm wavelength. An exposure energy of 7-8 mJ/cm² is required. After exposure, the film is heated for 90 seconds on a hot plate which is heated to 70° C. and subsequently developed for 60 seconds in an aqueous alkaline developing bath (Selectiplast PD 2007, Merck), whereupon the exposed zones are washed out (positive resist). The resist film is washed with deionised water and dried at 90° C. Analysis by electron scanning microscopy show clearly resolved submicron structures.

What is claimed is:

1. A radiation-sensitive composition comprising
   (a) a polyester containing structural repeating units of formula (I)

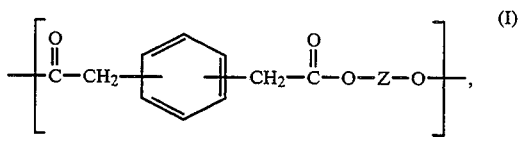

wherein Z is a radical of formulae (IIa)–(IIh)

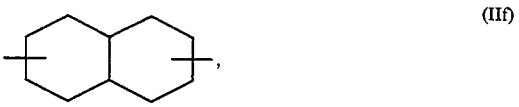

wherein Y is a direct bond, $C_1$–$C_{20}$alkylene, phenylene, —$CH_2$—$C_6H_4$—$CH_2$—, cyclopentylene or cyclohexylene, and $R_1$ and $R_2$ are each independently of the other hydrogen, methyl or ethyl, with the proviso that $R_1$ and $R_2$ are not simultaneously hydrogen, and (b) a substance that generates acid upon exposure to actinic radiation.

2. A composition according to claim 1, comprising as component (a) a polyester of formula (I), wherein Z is a group of formula (IIh).

3. A composition according to claim 2, wherein Y in formula (IIh) is 1,4-phenylene.

4. A composition according to claim 3, wherein in formula (IIh) $R_1$ is hydrogen and $R_2$ is methyl.

5. A composition according to claim 2, wherein in formula (IIh) Y is $C_1$–$C_{20}$alkylene, $R_1$ is hydrogen and $R_2$ is methyl.

6. A composition according to claim 1, comprising as component (a) a polyester of formula (I), wherein Z is 1,4-cyclohexylene.

7. A composition according to claim 1, comprising as component (a) a polyester of formula (D, wherein Z is the divalent radical of 1,4-dihydroxy-1,2,3,4-tetrahydronaphthalene after removal of the hydroxyl groups.

8. A composition according to claim 1, comprising as component (b) an iodonium, sulfonium or sulfoxonium salt.

9. A composition according to claim 1, comprising as component (b) triphenylsulfonium triflate or triphenylsulfonium hexafluoroantimonate.

10. A composition according to claim 1, comprising 85–99% by weight of component (a) and 1–15% by weight of component (b), based on the total amount of components (a) and (b).

11. A composition according to claim 1, comprising 92–98% by weight of component (a) and 2–8% by weight of component (b), based on the total amount of components (a) and (b).

12. The printing formes, printed circuits, integrated circuits or silver-free photographic films produced with a composition as claimed in claim 1.

* * * * *